(12) United States Patent
Chung

(10) Patent No.: US 12,480,048 B2
(45) Date of Patent: Nov. 25, 2025

(54) ETCHANT

(71) Applicant: TOKYO OHKA KOGYO CO., LTD., Kawasaki (JP)

(72) Inventor: Ming-Yen Chung, Kawasaki (JP)

(73) Assignee: TOKYO OHKA KOGYO CO., LTD., Kawasaki (JP)

( * ) Notice: Subject to any disclaimer, the term of this patent is extended or adjusted under 35 U.S.C. 154(b) by 237 days.

(21) Appl. No.: 18/313,122

(22) Filed: May 5, 2023

(65) Prior Publication Data
US 2023/0365864 A1    Nov. 16, 2023

(30) Foreign Application Priority Data

May 10, 2022 (TW) .................................. 111117526

(51) Int. Cl.
| | |
|---|---|
| *C09K 13/06* | (2006.01) |
| *C09K 13/00* | (2006.01) |
| *C23F 1/14* | (2006.01) |
| *C23F 1/26* | (2006.01) |
| *H01L 21/306* | (2006.01) |
| *H01L 21/311* | (2006.01) |
| *H01L 21/3213* | (2006.01) |
| *C09K 13/04* | (2006.01) |

(52) U.S. Cl.
CPC .............. *C09K 13/06* (2013.01); *C09K 13/00* (2013.01); *C23F 1/14* (2013.01); *C23F 1/26* (2013.01); *H01L 21/30604* (2013.01); *H01L 21/311* (2013.01); *H01L 21/31105* (2013.01); *H01L 21/31111* (2013.01); *H01L 21/32134* (2013.01); *C09K 13/04* (2013.01)

(58) Field of Classification Search
None
See application file for complete search history.

(56) References Cited

U.S. PATENT DOCUMENTS

| | | | |
|---|---|---|---|
| 2016/0053386 A1 | 2/2016 | Mizutani et al. | |
| 2017/0200601 A1* | 7/2017 | Song | ........................ C11D 7/08 |
| 2019/0103282 A1* | 4/2019 | Ge | ........................ H10D 30/014 |

FOREIGN PATENT DOCUMENTS

| | | | | |
|---|---|---|---|---|
| EP | 3076424 | * | 2/2023 | ......... H01L 2/32134 |
| JP | A-2016-536785 | | 11/2016 | |
| JP | B-6130810 | | 5/2017 | |
| WO | WO 2015/054460 A1 | | 4/2015 | |

* cited by examiner

*Primary Examiner* — Jiong-Ping Lu
(74) *Attorney, Agent, or Firm* — KNOBBE, MARTENS, OLSON & BEAR, LLP

(57) ABSTRACT

An etchant for selectively removing, from a semiconductor substrate, a tungsten-containing hard mask having compatibility with silicon germanium (SiGe) or silicon phosphorus (SiP), the etchant including an organic solvent, a sulfur-containing salt, and an oxidant.

5 Claims, No Drawings

ETCHANT

BACKGROUND OF THE INVENTION

Field of the Invention

The present invention relates to an etchant and more specifically a wet etchant used in a process of selectively removing a hard mask having compatibility with silicon germanium (SiGe) or silicon phosphorus (SiP).

Priority is claimed on Taiwan Patent Application No. 111117526 filed in Taiwan on May 10, 2022, the content of which is incorporated herein by reference.

DESCRIPTION OF RELATED ART

In a case where a fine circuit such as a semiconductor integrated circuit is prepared, unnecessary parts of a circuit board are required to be removed from the circuit board by immersing the circuit board in a solution so that the unnecessary parts are corroded and decomposed. The hard mask is formed by a film forming method such as CVD or sputtering and is used to define the space between circuits inside a gate and a metal wiring. However, in the process for selectively removing the hard mask having compatibility with silicon germanium (SiGe) or silicon phosphorus (SiP) by wet etching, since $GeO_2$ is dissolved as an oxide in a case where SiGe which is a gate material is used, electrical characteristics of a device may change.

A semiconductor substrate contains a low-k dielectric material having a hard mask of TiN, TaN, TiNxOy, TiW, W, Ti, or an alloy of Ti or W thereon. A removing composition for selectively removing a hard mask consisting essentially of TiN, TaN, TiNxOy, TiW, W, Ti, and an alloy of Ti and W from a low-k dielectric material of a semiconductor substrate is known. For example, PTL 1 describes a removing composition that contains 0.1% by weight to 90% by weight of an oxidant, 0.0001% by weight to 50% by weight of a carboxylic acid, and a remainder in an amount up to 100% by weight of a removing composition containing deionized water.

PTL 2 describes an etchant selectively removing a second layer from a semiconductor substrate including a first layer containing germanium (Ge) and a second layer containing a specific metal element other than germanium (Ge), in which the etchant contains a specific acidic compound selected from sulfuric acid (HSO), nitric acid (HNO), phosphoric acid (HPO), phosphonic acid (HPO), or an organic acid.

However, an etchant for selectively removing a tungsten-containing hard mask having compatibility with silicon germanium (SiGe) or silicon phosphorus (SiP) from a semiconductor substrate without damaging the substrate has been desired.

Documents of Related Art

[PTL 1] Published Japanese Translation No. 2016-536785 of the PCT International Publication
[PTL 2] Japanese Patent No. 6130810

SUMMARY OF THE INVENTION

Technical Problem

A wet etchant of the related art has a problem that in the process for selectively removing a hard mask, electrical characteristics of a device change because $GeO_2$ is dissolved as an oxide in a case where SiGe which is a gate material is used.

The hard mask is a typical poorly soluble compound consisting essentially of tungsten (W) and an alloy of tungsten, in which tungsten carbide has excellent acid resistance. The hard mask can be heated and decomposed using ammonium hydrogen sulfate.

An object of the present invention is to provide an etchant that selectively removes a tungsten-containing hard mask having compatibility with silicon germanium (SiGe) or silicon phosphorus (SiP) from a semiconductor substrate and that is capable of safely and efficiently etching a metal hard mask layer.

Solution to Problem

As a result of intensive examination conducted by the present inventors in order to achieve the above-described object, it was found that in a case where an etchant containing a specific organic sulfate contains an organic solvent (A), a sulfur-containing salt (B), and an oxidant (C) within specific ranges, a hard mask (tungsten carbide (hereinafter, also simply referred to as "WC")) can be selectively and remarkably removed. The present invention was completed based on such findings.

The etchant of the present invention selectively removes a hard mask having compatibility with silicon germanium (SiGe) from a semiconductor substrate.

In order to achieve the above-described object, the present invention employs the following configurations.

[1] An etchant for selectively removing, from a semiconductor substrate, a tungsten-containing hard mask having compatibility with silicon germanium (SiGe) or silicon phosphorus (SiP), the etchant including an organic solvent (A), a sulfur-containing salt (B), and an oxidant (C).

[2] The etchant according to [1], further including an acid (D).

[3] The etchant according to [1], in which the organic solvent (A) is at least one selected from the group consisting of ethylene glycol monopropyl ether (EGPE), diethylene glycol diethyl ether, tripropylene glycol methyl ether, ethylene glycol, propylene glycol (PG), neopentyl glycol, 1,3-propanediol, 1,2-butanediol, diethylene glycol, triethylene glycol, dipropylene glycol, butyl glycol, formamide, acetamide, a fatty acid amide having 3 or more carbon atoms, N-methylpyrrolidone (NMP), N,N-dimethylformamide, N,N-dimethylacetamide, sulfolane, dimethyl sulfoxide (DMSO), γ-butyrolactone, propylene carbonate, diethylene glycol monomethyl ether, triethylene glycol monomethyl ether, diethylene glycol monoethyl ether, triethylene glycol monoethyl ether, ethylene glycol monobutyl ether, diethylene glycol monobutyl ether, triethylene glycol monobutyl ether, ethylene glycol monohexyl ether, diethylene glycol monohexyl ether, ethylene glycol monophenyl ether, propylene glycol monomethyl ether (PGME), propylene glycol methyl ether, dipropylene glycol monomethyl ether (DPM), tripropylene glycol methyl ether, tripropylene glycol monomethyl ether, propylene glycol n-propyl ether, dipropylene glycol n-propyl ether (DPGPE), tripropylene glycol n-propyl ether, dipropylene glycol mono-n-butyl ether, tripropylene glycol mono-n-butyl ether, propylene glycol phenyl ether, and a combination of these solvents.

[4] The etchant according to [1], in which the sulfur-containing salt (B) is an organic sulfate.

[5] The etchant according to [4], in which the organic sulfate contains ammonium hydrogen sulfate ($(NH_4)HSO_4$) or ammonium sulfate ($(NH_4)_2SO_4$).

[6] The etchant according to [1], in which the oxidant (C) is hydrogen peroxide ($H_2O_2$).

[7] The etchant according to [2], in which the acid (D) is an organic acid or an inorganic acid.

[8] The etchant according to [1], in which the etchant contains 5% to 85% by weight of the organic solvent (A), 0.010% to 0.05% by weight of the sulfur-containing salt (B), 5% to 10% by weight of the oxidant (C), and a remainder consisting of water.

[9] The etchant according to [1], in which the etchant contains 5% to 85% by weight of the organic solvent (A), 0.010% to 0.05% by weight of the sulfur-containing salt (B), 5% to 10% by weight of the oxidant (C), 0.010% to 3% by weight of an acid (D), and a remainder consisting of water.

Advantageous Effects of Invention

According to the present invention, it is possible to provide an etchant that selectively removes a tungsten-containing hard mask having compatibility with silicon germanium (SiGe) or silicon phosphorus (SiP) from a semiconductor substrate without damaging the substrate and that is capable of safely and efficiently etching a metal hard mask layer.

DETAILED DESCRIPTION OF THE INVENTION

An embodiment of the present invention will be described below. Further, the present embodiment shows an example of the present invention, however, the present invention is not limited to the present embodiment. In addition, various changes or improvements can be added to the present embodiment, and forms to which such changes or improvements have been added can also be included in the present invention.

(Etchant)

An etchant of the present invention contains an organic solvent, a sulfur-containing salt, and an oxidant.

The etchant of the present invention is used to selectively remove a tungsten-containing hard mask having compatibility with silicon germanium (SiGe) or silicon phosphorus (SiP) without damaging a substrate.

In the etchant of the present embodiment, an etching rate A measured under the following conditions is 30 Å/min or greater, preferably 50 Å/min or greater, and more preferably 80 Å/min or greater, and the upper limit thereof is 100 Å/min or less and particularly preferably 90 Å/min or less.

In the etchant of the present embodiment, an etching rate B measured under the following conditions is 30 Å/min or less, preferably 25 Å/min or less, more preferably 20 Å/min or less, still more preferably 15 Å/min or less, and particularly preferably 10 Å/min or less.

(Measurement Conditions for Etching Rate A)

A semiconductor substrate having a layer of tungsten carbide ("WC") on the surface thereof is immersed in the etchant at 60° C., and the etching rate is measured.

(Measurement Conditions for Etching Rate B)

A semiconductor substrate having a $Si_{0.30}Ge_{0.70}$ layer on the surface thereof is immersed in the etchant at 60° C., and the etching rate is measured.

In a case where the etching rate A of the etchant according to the present embodiment is in a range of 30 to 100 Å/min, the selectivity of tungsten carbide ("WC") with respect to the SiGe compound (WC/SiGe 70%) is enhanced. Further, when the etching rate A of the etchant according to the present embodiment is greater than or equal to the lower limits of the above-described preferable ranges, the selectivity of "WC" with respect to the SiGe compound (WC/SiGe 70%) is further enhanced.

<Organic Solvent>

Examples of the organic solvent contained in the etchant of the present embodiment include at least one selected from the group consisting of an alcohol-based solvent (such as ethylene glycol, propylene glycol (PG), neopentyl glycol, 1,3-propanediol, 1,2-butanediol, diethylene glycol, triethylene glycol, butyl glycol, or dipropylene glycol), an amide-based solvent (such as formamide, acetamide, a fatty acid amide having 3 or more carbon atoms, N,N-dimethylformamide, or N,N-dimethylacetamide), sulfolane, dimethyl sulfoxide (DMSO), N-methylpyrrolidone (NMP), γ-butyrolactone, a carbonate-based solvent (such as ethylene carbonate or propylene carbonate, an ether-based solvent (such as diethylene glycol diethyl ether, tripropylene glycol methyl ether, diethylene glycol monomethyl ether, triethylene glycol monomethyl ether, triethylene glycol dimethyl ether, diethylene glycol monoethyl ether, diethylene glycol diethyl ether, triethylene glycol monoethyl ether, ethylene glycol monobutyl ether, diethylene glycol monobutyl ether, triethylene glycol monobutyl ether, diethylene glycol monohexyl ether, diethylene glycol monohexyl ether, ethylene glycol monophenyl ether, propylene glycol monomethyl ether (PGME), propylene glycol methyl ether, dipropylene glycol monomethyl ether (DPM), tripropylene glycol methyl ether, tripropylene glycol monomethyl ether, propylene glycol-n-propyl ether, dipropylene glycol-n-propyl ether (DPGPE), tripropylene glycol-n-propyl ether, dipropylene glycol mono-n-butyl ether, tripropylene glycol mono-n-butyl ether, or propylene glycol phenyl ether), and a combination thereof. Among these, as a polar organic solvent, an alcohol-based solvent, a carbonate-based solvent, or an ether-based solvent is preferable, a carbonate-based solvent or an ether-based solvent is more preferable, and one or more selected from the group consisting of propylene carbonate and dipropylene glycol monomethyl ether is still more preferable. The content of the solvent species is preferably 50% by mass or greater, more preferably 80% by mass or greater, still more preferably 90% by mass or greater and 100% by mass or less, and particularly 100% by mass with respect to the total amount of the organic solvent in the etchant.

The content of the organic solvent in the etchant of the present embodiment is, for example, in a range of 2% to 95% by weight, preferably in a range of 3% to 90% by weight, and more preferably 5% to 85% by weight with respect to the total weight of the etchant.

Further, among the polar organic solvents, propylene carbonate is used as a polar aprotic co-solvent. That is, the solubility of a poorly soluble compound is increased by adding a small amount of the co-solvent to a solvent.

The co-solvent contained in the etchant of the present embodiment suppresses the dissolution of $GeO_2$ and decreases the etching rate of SiGe.

The content of the co-solvent in the etchant of the present embodiment is, for example, in a range of 1% to 40% by weight, preferably in a range of 5% to 35% by weight, and more preferably in a range of 10% to 25% by weight.

<Sulfur-Containing Salt>

The etchant of the present embodiment contains a sulfur-containing salt, the sulfur-containing salt is an organic sulfate, and examples of the organic sulfate include ammonium hydrogen sulfate (($NH_4$)$HSO_4$) and ammonium sulfate (($NH_4$)$_2SO_4$).

Since the sulfur-containing salt contained in the etchant of the embodiment is adsorbed on the surface as an inhibitor of SiGe, the sulfur-containing salt decreases the etching rate of SiGe.

The content of the sulfur-containing salt in the etchant of the present embodiment is, for example, in a range of 0.001% to 0.20% by weight, preferably in a range of 0.003% to 0.15% by weight, and more preferably in a range of 0.008% to 0.13% by weight with respect to the total weight of the etchant.

In a case where the content of the sulfur-containing salt in the etchant of the present embodiment is in the above-described ranges, the selectivity with respect to the SiGe compound (WC/SiGe) is further enhanced.

<Oxidant>

The etchant of the present embodiment contains an oxidant, and examples of the oxidant include hydrogen peroxide, $FeCl_3$, $FeF_3$, $Fe(NO_3)_3$, $Sr(NO_3)_2$, $CoF_3$, $MnF_3$, oxone ($2KHSO_5 \cdot KHSO_4 \cdot K2SO_4$), iodic acid, vanadium oxide (V), vanadium oxide (IV, V), ammonium vanadate, ammonium peroxomonosulfate, ammonium chlorite, ammonium chlorate, ammonium iodate, ammonium nitrate, ammonium perborate, ammonium perchlorate, ammonium periodate, ammonium persulfate, ammonium hypochlorite, ammonium hypobromite, ammonium tungstate, sodium persulfate, sodium hypochlorite, sodium perborate, sodium hypobromite, potassium iodate, potassium permanganate, potassium persulfate, nitric acid, potassium hypochlorite, tetramethylammonium chlorite, tetramethylammonium chlorate, tetramethylammonium iodate, tetramethylammonium perborate, tetramethylammonium perchlorate, tetramethylammonium periodate, and tetramethylammonium persulfate. Among these, hydrogen peroxide is preferable as the oxidant.

The oxidant contained in the etchant of the present embodiment may be used alone or in combination of two or more kinds thereof.

The content of the oxidant in the etchant of the present embodiment is, for example, in a range of 5% to 50% by weight, preferably in a range of 6% to 30% by weight, more preferably in a range of 7% to 20% by weight, and still more preferably 8% to 10% by weight with respect to the total weight of the etchant.

In a case where the content of the oxidant is in the above-described ranges, the selectivity of "WC/SiGe" with respect to the SiGe compound is likely to be further improved.

<Other Components>

The etchant of the present embodiment may contain other components in addition to the above-described components within a range that does not impair the effects of the present invention. Examples of the other components include solvents other than the above-described organic solvents, pH adjusting agents, and surfactants.

<Other Solvents>

It is preferable that the etchant of the present embodiment is prepared by mixing the sulfur-containing salt, the oxidant, and other optional components with the solvent. As the solvent, other known organic solvents may be used in addition to the above-described organic solvents.

<Water>

In a case where the etchant of the present embodiment contains water as the solvent, the water may contain a trace amount of components that are unavoidably mixed. As the water used in the etchant of the present embodiment, water that has been subjected to a purification treatment such as distilled water, ion exchange water, or ultrapure water is preferable, and ultrapure water typically used for manufacture of semiconductors is more preferable.

In a case where the etchant of the present embodiment contains water, the content of water is, for example, in a range of 4% to 50% by weight, preferably in a range of 6% to 45% by weight, more preferably in a range of 8% to 40% by weight, and still more preferably in a range of 10% to 30% by weight with respect to the total weight of the etchant.

<pH Adjusting Agent>

The etchant of the present embodiment may contain a pH adjusting agent in order to further improve the etching rate with respect to "WC". At least one selected from the group consisting of acids and salts thereof is preferable as the pH adjusting agent. Specific examples thereof include methanesulfonic acid, trifluoromethanesulfonic acid, an oxalic acid dihydrate, citric acid, tartaric acid, picolinic acid, succinic acid, acetic acid, lactic acid, sulfosuccinic acid, benzoic acid, propionic acid, formic acid, pyruvic acid, maleic acid, malonic acid, fumaric acid, malic acid, ascorbic acid, mandelic acid, heptanoic acid, butyric acid, valeric acid, glutaric acid, phthalic acid, hypophosphorous acid, salicylic acid, 5-sulfosalicylic acid, hydrochloric acid, ethanesulfonic acid, butanesulfonic acid, p-toluenesulfonic acid, dichloroacetic acid, difluoroacetic acid, monochloroacetic acid, monofluoroacetic acid, trichloroacetic acid, trifluoroacetic acid, hydrobromic acid (62% by weight), sulfuric acid, ammonium acetate, sodium acetate, potassium acetate, tetramethylammonium acetate and other tetraalkylammonium acetates, phosphonium acetate, ammonium butyrate, ammonium trifluoroacetate, ammonium carbonate, ammonium chloride, ammonium sulfate, ammonium hydrogen sulfate, ammonium nitrate, phosphoric acid, diammonium hydrogen phosphate, ammonium dihydrogen phosphate, bis(tetramethylammonium) hydrogen phosphate, disodium hydrogen phosphate, sodium dihydrogen phosphate, dipotassium hydrogen phosphate, potassium dihydrogen phosphate, tetraalkylammonium hydrogen phosphate, tetraalkylammonium dihydrogen phosphate, diphosphonium hydrogen phosphate, phosphonium dihydrogen phosphate, ammonium phosphonate, tetraalkylammonium phosphonate, sodium phosphonate, potassium phosphonate, phosphonium phosphonate, and salts thereof. Among these, ammonium sulfate or ammonium hydrogen sulfate is preferable as the pH adjusting agent.

In the etchant of the present embodiment, the pH adjusting agent may be used alone or in combination of two or more kinds thereof.

In a case where the etchant of the present embodiment contains a pH adjusting agent, the content of the pH adjusting agent is, for example, in a range of 0.005% to 10% by weight, preferably in a range of 0.010% to 4.5% by weight, more preferably in a range of 0.012% to 1% by weight, and still more preferably in a range of 0.013% to 0.5% by weight with respect to the total weight of the etchant. In a case where the content of the pH adjusting agent is in the above-described ranges, the etching rate with respect to "WC" is likely to be further improved.

The pH of the etchant according to the present embodiment is 0.5 or greater and 3 or less, preferably 0.8 or greater and 2.7 or less, more preferably 1.0 or greater and 2.5 or less, and still more preferably 1.0 or greater and 2.0 or less.

In a case where the etchant of the present embodiment contains an acid, the content of the acid is, for example, in a range of 0.001% to 3% by weight, preferably in a range of 0.005% to 2.5% by weight, more preferably in a range of 0.010% to 2% by weight, and still more preferably in a range of 0.015% to 1.5% by weight with respect to the total weight of the etchant.

<Object to be Treated>

The etchant of the present embodiment is used to selectively remove a tungsten-containing hard mask having compatibility with silicon germanium (SiGe) or silicon phosphorus (SiP) from a semiconductor substrate, and an object to be treated, which contains "WC", is the target of the etching treatment. The object to be treated is not particularly limited as long as the object contains "WC", and examples thereof include a substrate having a SiGe compound-containing layer (SiGe compound-containing film). The substrate is not particularly limited, and examples thereof include various substrates such as a semiconductor wafer and a glass substrate for a photomask. A substrate used for manufacturing a semiconductor device is preferable as the substrate.

The SiGe compound-containing layer is preferably a layer containing a SiGe compound and more preferably a SiGe compound film. The thickness of the SiGe compound-containing layer on the substrate is not particularly limited and can be appropriately selected according to the purpose thereof.

It is preferable that the object to be treated contains a SiGe compound in addition to "WC". The etchant of the present embodiment may be used to microfabricate a "WC"-containing layer in the substrate.

<Step of performing etching treatment on object to be treated>

The present step is a step of performing an etching treatment on the object to be treated, which contains "WC", using the etchant of the present embodiment and includes an operation of bringing the etchant into contact with the object to be treated. A method of performing the etching treatment is not particularly limited, and a known etching method can be used. Examples of such a method include a spray method, a dipping method, and a liquid filling method, and the present invention is not limited thereto.

In the spray method, for example, the object to be treated is transported or rotated in a predetermined direction, and the etchant according to the first aspect is sprayed into the space so that the etchant is brought into contact with the object to be treated. The etchant may be sprayed while the substrate rotates using a spin coater as necessary.

In the immersion method, the object to be treated is immersed in the etchant of the present embodiment so that the etchant is brought into contact with the object to be treated.

In the liquid filling method, the object to be treated is filled with the etchant of the present embodiment so that the etchant is brought into contact with the object to be treated.

These etching methods can be appropriately selected according to the structure, the material, and the like of the object to be treated. In a case of the spray method or the liquid filling method, the amount of the etchant supplied to the object to be treated may be an amount set such that a surface to be treated in the object to be treated is sufficiently wet with the etchant.

The purpose of the etching treatment is not particularly limited, and may be microfabrication of the surface to be treated, which contains WC, in the object to be treated (for example, "WC" on the substrate). In a case where the purpose of the etching treatment is to remove "WC" from the object to be treated, "WC" can be removed by bringing the etchant of the present invention into contact with the object to be treated to dissolve "WC".

The temperature of performing the etching treatment is not particularly limited as long as "WC" is dissolved in the etchant at the temperature. The temperature of the etching treatment is, for example, in a range of 30° C. to 60° C. In any of the spray method, the dipping method, or the liquid filling method, the etching rate is improved by increasing the temperature of the etchant, but the treatment temperature can be appropriately selected in consideration of minimizing a change in composition of the etchant, and the workability, the safety, and the cost.

The time for performing the etching treatment may be appropriately selected according to the purpose of the etching treatment, the amount of "WC" to be removed by carrying out etching (for example, the thickness or the amount of the "WC"-containing layer), and the conditions for the etching treatment. Since the hard mask contains tungsten, the hard mask can be completely removed at a substantially relatively low temperature in a range of 30° C. to 60° C.

EXAMPLES

Hereinafter, the present invention will be described in more detail based on examples, but the present invention is not limited to these examples.

Examples 1 to 7 and Comparative Examples 1 to 9

Each component listed in Table 1 was mixed to prepare an etchant for each example.

"Preparation of Test Piece"

1.5×1.5 cm WC test pieces accumulated on a silicon wafer were obtained by cutting a 300 mm wafer.

1.5×1.5 cm SiGe test pieces were obtained by cutting a 150 mm SiGe wafer and accumulating SiGe having a thickness of 10 nm on $SiO_2$ (100 nm thermal oxide/Si).

"Measurement of Thickness"

Each test piece was immersed in a cleaning liquid, and the thickness thereof was measured using an X-ray diffractometer (RIGAKU Corporation).

"Measurement of Etching Rate"

The etching rate was calculated by dividing a difference in thickness by the immersion time.

In Table 1, each abbreviation has the following meaning. The numerical values in the brackets denote the blending amounts (% by weight).

Organic solvent:
A-1: dipropylene glycol monomethyl ether (DPM)
A-2: propylene carbonate (propylene carbonate) (PC)
A-1/A-2 (DPM/PC)
Organic sulfate:
B-1 ammonium hydrogen sulfate $((NH_4)HSO_4)$
B-2 ammonium sulfate $((NH_4)_2SO_4)$
Oxidant: hydrogen peroxide $(H_2O_2)$
pH adjusting agent: sulfuric acid, acetic acid, nitric acid, or phosphoric acid <Etching Treatment of Object to be Treated>

A semiconductor substrate having a "WC" layer on the surface thereof was immersed in the etchant at 60° C., and the etching rate was measured. The results are listed in Table 2.

A semiconductor substrate having a $Si_{0.30}Ge_{0.70}$ layer on the surface thereof was immersed in the etchant at 60° C., and the etching rate was measured. The results are listed in Table 2.

"Evaluation of SiGe 70% Etching Rate"

The SiGe 70% etching rate was evaluated according to the following criteria. For example, the etching rate was evaluated as "A" which means satisfactory in a case where the SiGe 70% etching rate was 8 or greater and less than 14, the etching rate was evaluated as "B" which means good in a case where the SiGe 70% etching rate was 14 or greater and less than 22, and the etching rate was evaluated as "C" which means poor in a case where the SiGe 70% etching rate was 22 or greater.

A: The etching rate was 8 or greater and less than 14
B: The etching rate was 14 or greater and less than 22
C: The etching rate was 22 or greater As shown in the results listed in Table 1, it was confirmed that the SiGe 70% etching rates of Examples 1 to 7 were better than the SiGe 70% etching rates of Comparative Examples 1 to 9.

"Evaluation of WC/SiGe70% Selection Ratio"

The selection ratio of WC/SiGe70% was evaluated according to the following criteria. For example, the selection ratio of WC/SiGe70% was evaluated as "A" which means satisfactory in a case where the selection ratio was 3 or greater, the selection ratio of WC/SiGe70% was evaluated as "B" which means good in a case where the selection ratio was 1.9 or greater and less than 3, and the selection ratio of WC/SiGe70% was evaluated as "C" which means poor in a case where the selection ratio was less than 1.9.

A: The WC/SiGe70% selection ratio was 3 or greater
B: The WC/SiGe70% selection ratio was 1.9 or greater and less than 3
C: The WC/SiGe70% selection ratio was less than 1.9

As shown in the results listed in Table 2, it was confirmed that the etchants of Examples 1 to 7 each had a higher WC/SiGe 70% selection ratio than that of the etchants of Comparative Examples 1 to 9.

In Examples 1 to 7 in which the etchants of the examples contained an organic sulfate (ammonium sulfate (($NH_4$)$_2SO_4$) or ammonium sulfate (($NH_4$)$_2SO_4$)), the SiGe 70% etching rate was satisfactory and the WC/SiGe 70% selection ratio was also excellent as compared with Comparative Examples 1 to 9 in which the etchants contained no organic sulfate described above.

INDUSTRIAL APPLICABILITY

According to the etchant of the present invention, it is possible to provide an etchant that selectively removes a tungsten-containing hard mask having compatibility with silicon germanium (SiGe) or silicon phosphorus (SiP) from a semiconductor substrate without damaging the substrate and that is capable of safely and efficiently etching a hard mask layer.

TABLE 1

| | Organic solvent | | Sulfur-containing salt | | Oxidant | | Acid | | Water |
|---|---|---|---|---|---|---|---|---|---|
| | | Addition amount (wt %) | | Addition amount (wt %) | | Addition amount (wt %) | | Addition amount (wt %) | (remainder) |
| Example-1 | A-1 | 71 | B-1 | 0.03 | $H_2O_2$ | 9 | None | 0 | Remainder |
| Example-2 | A-1 | 71 | B-2 | 0.015 | $H_2O_2$ | 9 | Sulfuric acid | 0.014 | Remainder |
| Example-3 | A-1/A-2 | 52/25 | B-2 | 0.015 | $H_2O_2$ | 9 | Sulfuric acid | 0.014 | Remainder |
| Example-4 | A-1/A-2 | 56/25 | B-2 | 0.015 | $H_2O_2$ | 6 | Sulfuric acid | 0.014 | Remainder |
| Example-5 | A-1 | 71.5 | B-2 | 0.112 | $H_2O_2$ | 8.6 | Sulfuric acid | 0.144 | Remainder |
| Example-6 | A-1 | 71.31 | B-2 | 0.075 | $H_2O_2$ | 8.6 | Sulfuric acid | 0.144 | Remainder |
| Example-7 | A-1 | 71.08 | B-2 | 0.112 | $H_2O_2$ | 8.6 | Sulfuric acid | 0.173 | Remainder |
| Comparative Example-1 | A-1 | 68 | None | 0 | $H_2O_2$ | 10 | Sulfuric acid | 0.1 | Remainder |
| Comparative Example-2 | A-1 | 67.6 | None | 0 | $H_2O_2$ | 10 | Sulfuric acid | 0.1 | Remainder |
| Comparative Example-3 | A-1 | 67.6 | "*" Ammonium chloride | 0.1 | $H_2O_2$ | 10 | None | 0 | Remainder |
| Comparative Example-4 | A-1 | 67.6 | "*" Ammonium dihydrogen phosphate | 0.1 | $H_2O_2$ | 10 | None | 0 | Remainder |
| Comparative Example-5 | A-1 | 67.6 | "*" Ammonium acetate | 0.1 | $H_2O_2$ | 10 | None | 0 | Remainder |
| Comparative Example-6 | A-1 | 67.6 | "*" Ammonium nitrate | 0.1 | $H_2O_2$ | 10 | None | 0 | Remainder |
| Comparative Example-7 | A-1 | 67.6 | "*" Diammonium hydrogen phosphate | 0.1 | $H_2O_2$ | 10 | None | 0 | Remainder |
| Comparative Example-8 | A-1 | 67.6 | None | 0 | $H_2O_2$ | 10 | Sulfuric acid | 0.1 | Remainder |
| Comparative Example-9 | A-1 | 67.6 | None | 0 | $H_2O_2$ | 10 | Phosphoric acid | 0.2 | Remainder |

Components with the symbol "*" denote components that do not correspond to the sulfur-containing salt

TABLE 2

| | Temperature of etching treatment (° C.) | Etching rate (Å/min) | | Evaluation of SiGe 70% etching rate | Etching selection ratio | |
|---|---|---|---|---|---|---|
| | | WC | SiGe 70% | | WC/ SiGe 70% | Evaluation of WC/ SiGe 70% |
| Example-1 | 60 | 50.5 | 16.5 | B | 3.1 | A |
| Example-2 | 60 | 48.2 | 15.3 | B | 3.2 | A |
| Example-3 | 60 | 56.1 | 14.3 | B | 3.9 | A |
| Example-4 | 60 | 53.4 | 8.3 | A | 6.5 | A |
| Example-5 | 60 | 53.9 | 16.3 | B | 2.5 | B |
| Example-6 | 60 | 46.9 | 21.3 | B | 2.2 | B |
| Example-7 | 60 | 47.5 | 19.8 | B | 2.4 | B |
| Comparative Example-1 | 60 | 53.9 | 51.1 | C | 1.1 | C |
| Comparative Example-2 | 60 | 53.9 | 51.1 | C | 1.1 | C |
| Comparative Example-3 | 60 | 41.9 | 35.7 | C | 1.2 | C |
| Comparative Example-4 | 60 | 24 | 31.6 | C | 0.76 | C |
| Comparative Example-5 | 60 | 41.7 | 60.5 | C | 0.69 | C |
| Comparative Example-6 | 60 | 27.35 | 38.15 | C | 0.72 | C |
| Comparative Example-7 | 60 | 37.55 | 52.75 | C | 0.71 | C |
| Comparative Example-8 | 60 | 53.9 | 51.1 | C | 1.1 | C |
| Comparative Example-9 | 60 | 37 | 25.7 | C | 1.4 | C |

SiGe 70% denotes the concentration of Ge (70%) in SiGe

While preferred embodiments of the invention have been described and illustrated above, it should be understood that these are exemplary of the invention and are not to be considered as limiting. Additions, omissions, substitutions, and other modifications can be made without departing from the scope of the invention. Accordingly, the invention is not to be considered as being limited by the foregoing description and is only limited by the scope of the appended claims.

What is claimed is:

1. An etchant for selectively removing, from a semiconductor substrate, a tungsten-containing hard mask having compatibility with silicon germanium (SiGe) or silicon phosphorus (SiP), the etchant comprising:
    an organic solvent (A);
    a sulfur-containing salt (B) containing ammonium hydrogen sulfate ($(NH_4)HSO_4$) or ammonium sulfate ($(NH_4)_2SO_4$); and
    an oxidant (C) which is hydrogen peroxide,
    wherein the etchant contains 5% to 85% by weight of the organic solvent (A), 0.010% to 0.05% by weight of the sulfur-containing salt (B), 5% to 10% by weight of the oxidant (C), and a remainder consisting of water.

2. The etchant according to claim 1, further comprising an acid (D).

3. The etchant according to claim 2, wherein the acid (D) is an organic acid or an inorganic acid.

4. The etchant according to claim 1, wherein the organic solvent (A) is at least one selected from the group consisting of ethylene glycol monopropyl ether (EGPE), diethylene glycol diethyl ether, tripropylene glycol methyl ether, ethylene glycol, propylene glycol (PG), neopentyl glycol, 1,3-propanediol, 1,2-butanediol, diethylene glycol, triethylene glycol, dipropylene glycol, butyl glycol, formamide, acetamide, a fatty acid amide having 3 or more carbon atoms, N-methylpyrrolidone (NMP), N,N-dimethylformamide, N,N-dimethylacetamide, sulfolane, dimethyl sulfoxide (DMSO), y-butyrolactone, propylene carbonate, diethylene glycol monomethyl ether, triethylene glycol monomethyl ether, diethylene glycol monoethyl ether, triethylene glycol monoethyl ether, ethylene glycol monobutyl ether, diethylene glycol monobutyl ether, triethylene glycol monobutyl ether, ethylene glycol monohexyl ether, diethylene glycol monohexyl ether, ethylene glycol monophenyl ether, propylene glycol monomethyl ether (PGME), propylene glycol methyl ether, dipropylene glycol monomethyl ether (DPM), tripropylene glycol methyl ether, tripropylene glycol monomethyl ether, propylene glycol n-propyl ether, dipropylene glycol n-propyl ether (DPGPE), tripropylene glycol n-propyl ether, dipropylene glycol mono-n-butyl ether, tripropylene glycol mono-n-butyl ether, propylene glycol phenyl ether, and a combination thereof.

5. An etchant for selectively removing, from a semiconductor substrate, a tungsten-containing hard mask having compatibility with silicon germanium (SiGe) or silicon phosphorus (SiP), the etchant comprising:
    an organic solvent (A);
    a sulfur-containing salt (B) containing ammonium hydrogen sulfate ($(NH_4)HSO_4$) or ammonium sulfate ($(NH_4)2SO_4$); and
    an oxidant (C) which is hydrogen peroxide ($H_2O_2$),
    wherein the etchant contains 5% to 85% by weight of the organic solvent (A), 0.010% to 0.05% by weight of the sulfur-containing salt (B), 5% to 10% by weight of the oxidant (C), 0.010% to 3% by weight of an acid (D), the remainder consisting of water.

\* \* \* \* \*